United States Patent

Saito

[11] Patent Number: 5,815,007
[45] Date of Patent: Sep. 29, 1998

[54] MORE-THAN-ONE DETECTOR

[75] Inventor: Tatsuya Saito, Tokyo, Japan

[73] Assignee: NEC Corporation, Tokyo, Japan

[21] Appl. No.: 632,391

[22] Filed: Apr. 10, 1996

[30] Foreign Application Priority Data

Apr. 12, 1995 [JP] Japan .................................. 7-086722

[51] Int. Cl.$^6$ ...................... H03K 19/094; H03K 19/082
[52] U.S. Cl. ........................... 326/121; 326/108; 341/102
[58] Field of Search ............................. 326/36, 55, 108, 326/121; 341/94, 8, 102, 103

[56] References Cited

U.S. PATENT DOCUMENTS

| | | | |
|---|---|---|---|
| 3,900,742 | 8/1975 | Hampel et al. | 326/121 |
| 4,069,426 | 1/1978 | Hirasawa | 326/108 |
| 4,584,567 | 4/1986 | Kinghorn | 341/102 |
| 4,745,306 | 5/1988 | Shimada | 326/121 |

Primary Examiner—Edward P. Westin
Assistant Examiner—Richard Roseen
Attorney, Agent, or Firm—Young & Thompson

[57] ABSTRACT

In order to provide a detector with fewer switching elements for detecting simultaneous occurrence of more than one of logic '1' or logic '0' out of plural inputs, 4 inputs A, B, C and D for example, a detector of the invention detects more than one of logic '1' from NAND logic of outputs of 3 OR-NAND composit gates as follows.

$A \cdot B + A \cdot C + A \cdot D + B \cdot C + B \cdot D + C \cdot D =$
    $\text{NOT}(\text{NOT}(A \cdot (B + C + D)) + \text{NOT}((A + B) \cdot (C + D)) +$
    $\text{NOT}((A + B + C) \cdot D))$ Each OR-NAND composit gate is composed of 4 pMOS transistors for common use and 4 nMOS transistors and a NAND gate of 3 inputs is composed of 3 pMOS transistors and 3 nMOS transistors.

Therefore, the detector of 4 inputs of the invention can be composed of 22 MOSFETs insted of 36 MOSFETs needed for a conventional detector of 6 NAND gates of 2 inputs and a NAND gate of 6 inputs.

2 Claims, 5 Drawing Sheets

MORE-THAN-ONE DETECTOR

BACKGROUND OF THE INVENTION

This invention relates to a detector circuit, and more particularly to a detector circuit for discriminating occurrence of more than one of logic '1' or logic '0', hereafter called a more-than-one detector.

The more-than-one detector is used recently as a fault detecting circuit for decoders or an arbitaration circuit of bus lines in a microcomputer.

In general, in a decorder having a plurality of input and output terminals, only one output terminal is activated, determined according to an example of each input logic. Therefore, a more-than-one detector is used for detecting if more than one output terminal are activated in a decoder that is out of order.

The bus line arbitaration circuit, which is for surveying bus line requests from bus masters for allocating a use of bus lines to one bus master, should change its control according to a number of simultaneous bus line requests. When there arises only one request, the use of bus lines is given to the requesting bus master, and when more than one bus master are requesting the use, it should be given to a bus master according to priorities determined for each request. Therefore, a more-than-one detector is provided in a bus line arbitaration circuit for discriminating whether there are more than one request or not.

FIG. 5 is a circuit diagram of an example having four inputs of a conventional more-than-one detector.

In order to detect logic '1' of at least two inputs out of the four inputs, the conventional more-than-one detector comprises six NAND gates of two inputs, (six means a number of permutation combinations of two elements out of four elements, namely $6={}_4C_2$), six outputs of them supplied to another NAND gate of six inputs.

The six NAND gates of two inputs of FIG. 5 have the same configulation and are described referring to NAND gate 1. The NAND gate 1 comprises pMOS transistors MP111 and MP112 connected in parallel between an output terminal T and a positive supply VDD and nMOS transistors MN111 and MN112 connected in series between the output terminal T and a negative supply VSS. An input signal A gates the MOSFETs MP111 and MN111 while another input signal B gates the MOSFETs MP112 and MN112.

The NAND gate 10 of six inputs similarly comprises six pMOS transistors MP11 to MP106 connected in parallel between an output terminal OUT and the positive supply VDD and six nMOS transistors MN101 to MN106 connected in series between the output terminal OUT and the negative terminal VSS, and wherein, the output terminal T of the NAND gate 1 is connected to the gates of MOSFETs MP101 and MN 101 and similarly each output terminal of NAND gates 2 to 6 is connected to gates of each pair of MOSFETs MP102 and MN102 to MP106 and MN106 respectively.

With the NAND gate 10 of six inputs supplied from six NAND gates 1 to 6 of two inputs thus configured, simultaneous occurrence of more than one logic '1' of four inputs can be detected by logic '1' of the output terminal OUT, as follows;

$$\begin{aligned} \text{OUT} &= \text{NOT}(\text{NOT}(A \cdot B) \cdot \text{NOT}(A \cdot C) \cdot \text{NOT}(A \cdot D) \cdot \\ &\quad \text{NOT}(B \cdot C) \cdot \text{NOT}(C \cdot D)) \\ &= A \cdot B + A \cdot C + A \cdot D + B \cdot C + B \cdot D + C \cdot D, \end{aligned}$$

where NOT(X) represents inverted logic of X, and A to D and OUT mean logic of corresponding input/outputs respectively.

A number of MOSFETs needed for the more-than-one detector of n inputs will be considered in the following paragraphs, n being an integer more than 2.

There are needed ${}_nC_2=n(n-1)/2$ of two input NAND gates together with a NAND gate of $n(n-1)/2$ inputs. Therefore, the number of MOSFETs for the more-than-one detector is represented by following table, where primary stage means an assembly of $n(n-1)/2$ NAND gates of two inputs and secondary stage means a NAND gate of $n(n-1)/2$ inputs.

|  | No. of pMOSs | No. of nMOSs | Total |
| --- | --- | --- | --- |
| primary stage | $\{n(n-1)/2\} \cdot 2$ | $\{n(n-1)/2\} \cdot 2$ | $n(n-1) \cdot 2$ |
| secondary stage | $n(n-1)/2$ | $n(n-1)/2$ | $n(n-1)$ |
| Total | $\{n(n-1) \cdot 3\}/2$ | $\{n(n-1) \cdot 3\}/2$ | $n(n-1) \cdot 3$ |

Therefore, $\{n(n-1)\cdot 3\}/2$ of pMOS transistors and the same of nMOS transistors are needed, resulting a total of $n(n-1)\cdot 3$ MOSFETs, approximately proportional to $3n^2$.

Now, the layout area of the MOSFETs is calculated on condition that;

SN represents layout area of a nMOS transistor having its minimum channel width WN, and 2SN is the layout area of a pMOS transistor having its minimum channel width 2WN.

Results are as follows.

|  | Area for pMOSs | Area for nMOSs | Total |
| --- | --- | --- | --- |
| primary stage | $SN \cdot n(n-1) \cdot 2$ | $SN \cdot n(n-1)$ | $SN \cdot n(n-1) \cdot 3$ |
| secondary stage | $SN \cdot n(n-1)$ | $SN \cdot n(n-1)/2$ | $SN \cdot n(n-1) \cdot 3/2$ |
| Total | $SN \cdot n(n-1) \cdot 3$ | $SN \cdot n(n-1) \cdot 3/2$ | $SN \cdot n(n-1) \cdot 9/2$ |

An area of $SN \cdot n(n-1) \cdot 3$ for pMOS transistors and an area of $SN \cdot n(n-1) \cdot 3/2$ for nMOS transistors are needed for a layout of a conventional more-than-one detector, resulting in a total of $SN \cdot n(n-1) \cdot 9/2$.

The larger number of transistors need the larger layout area accompanied by the longer wiring and the larger capacitance, resulting in lower operational speed and larger power dissipation.

SUMMARY OF THE INVENTION

Therefore, a primary object of the invention is to provide a more-than-one detector with a small number of MOSFETs.

In order to achieve the object, a more-than-one detector of n input signals, n being an integer larger than two of an embodiment of the present invention comprises:

a serial connection of n first type switching transistors, both ends of the serial connection connected to a terminal of a power supply and each of the first type switching transistors gated by each of the n input signals respectively;

n−1 sets of two stage cascaded connection provided between the other terminal of the power supply and n−1 connections of the n first type transistors respectively, a first set of the n−1 sets of two stage cascaded connection consisting of a stage of a second type switching transistor gated by a first signal of the n input signals and a stage of a parallel connection of n−1 second type switching transistors gated by the latter n−1 signals of the n input signals, a last set of the n−1 sets of the two stage cascaded connection consisting of a stage of n−1 second type switching transistors gated by the first n−1 signals of the n input signals and a stage of a second type switching transistor gated by a last signal of the n input signals, and each i-th set of the n−1 sets of the two stage cascaded connections consisting of a stage of a parallel connection of i second type switching transistors gated by the first i signals of the n input signals and a stage of a parallel connection of n−i second type switching transistors gated by latter n−i signals of the n input signals, i being an integer more than one and smaller than n−1; and a NAND gate of n−1 inputs, each of the n−1 inputs connected to the n−1 connections of the n first type switching transistors.

Therefore, a more-than-one detector with fewer switching transistors is provided in the invention than in a conventional more-than-one detector, resulting in faster operational speed.

BRIEF DESCRIPTION OF THE DRAWINGS

The foregoing, further objects, features, and advantages of this invention will become apparent from a consideration of the following description, the appended claims, and the accompanying drawings in which the same numerals indicate the same or the corresponding parts.

DETAILED DESCRIPTION OF THE PREFERRED EMBODIMENTS

Now, embodiments of the present invention will be described in connection with the drawings.

Figure 1:
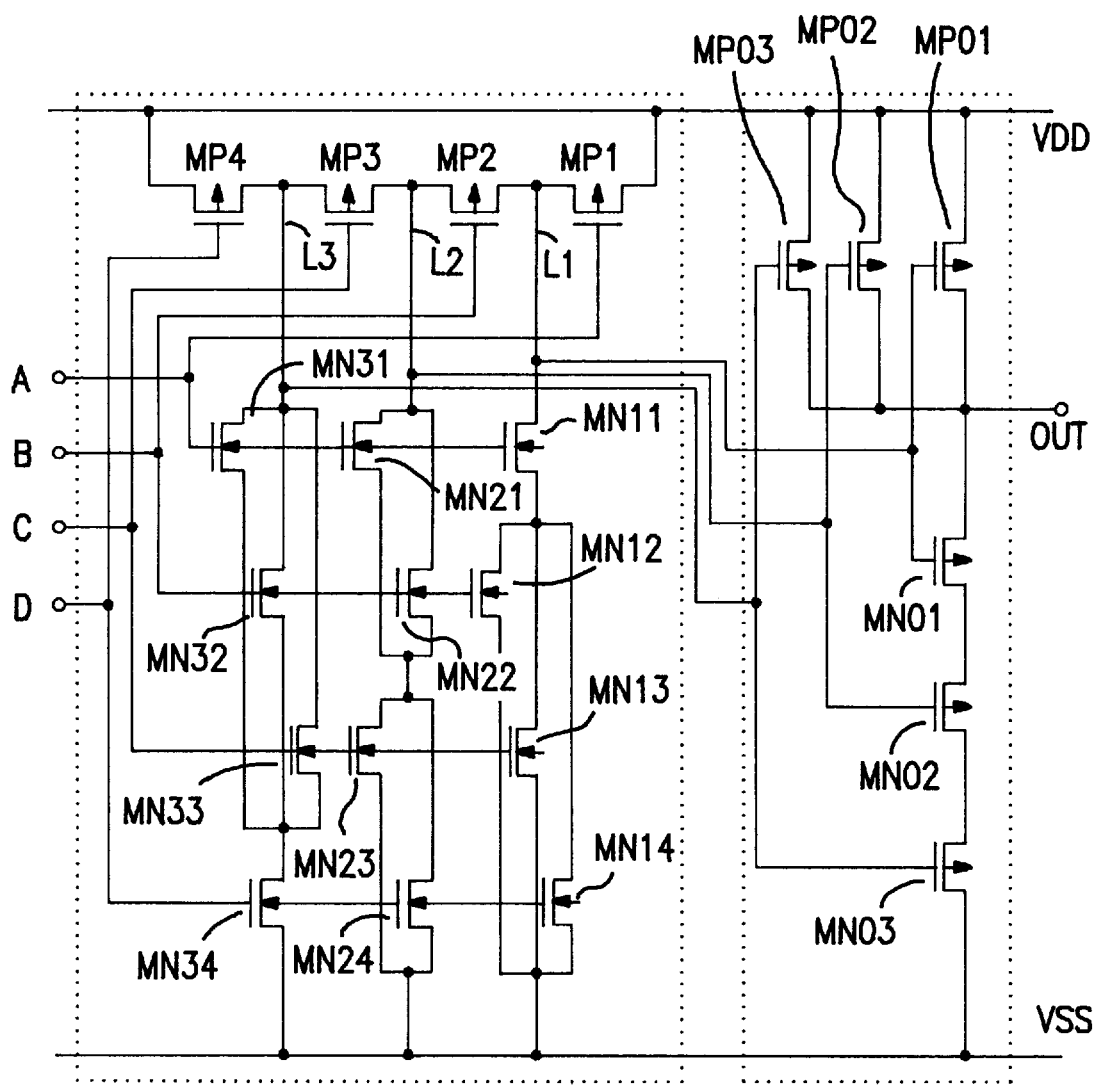
FIG. 1 is a circuit diagram illustrating a more-than-one detector of a first embodiment of the present invention, having four inputs by way of example.

FIG. 1 is a circuit diagram illustrating a more-than-one detector of a first embodiment of the present invention, having four inputs by way of example.

The more-than-one detector of FIG. 1 has a three input NAND gate supplied with three outputs of a primary stage. The primary stage comprises:

a serial connection of a first, a second, a third and a fourth pMOS transistors MP1 to MP4 with both ends connected to a positive supply VDD;

a first, a second and a third output lines L1, L2 and L3 connected to each connection between the first and the second pMOS transistors MP1 and MP2, between the second and the third pMOS transistors MP2 and MP3 and between the third and the fourth pMOS transistors MP3 and MP4 respectively;

a first two stage cascaded connection of nMOS transistors consisting of a first nMOS transistor MN11 and a parallel connection of a second, a third and a fourth NMOS transistors MN12, MN13 and MN14 between the first output line L1 and a negative supply VSS;

a second two stage cascaded connection of nMOS transistors consisting of a parallel connection of a fifth and a sixth nMOS transistors MN21 and MN22 and a parallel connection of a seventh and a eighth nMOS transistors MN23 and MN24 between the second output line L2 and the negative supply VSS;

a third two stage cascaded connection of nMOS transistors consisting of a parallel connection of a ninth, a tenth and a eleventh nMOS transistors MN31, MN32 and MN33 and a twelfth nMOS transistor MN34 between the third output line L3 and the negative supply VSS;

a first input terminal connected to gates of the first pMOS transistor MP1 and the first, the fifth and the ninth nMOS transistors MN11, MN21 and MN31;

a second input terminal connected to gates of the second pMOS transistor MP2 and the second, the sixth and the tenth nMOS transistors MN12, MN22 and MN32;

a third input terminal connected to gates of the third pMOS transistor MP3 and the third, the seventh and the eleventh nMOS transistors MN13, MN23 and MN33; and a fourth input terminal connected to gates of the fourth pMOS transistor MP4, and the fourth, the eighth and the twelfth nMOS transistors MN14, MN24 and MN34.

The three input NAND gate having three nMOS transistors and three pMOS transistors has a similar circuit configuration with the NAND gate 10 of FIG. 6 and a dublicate description is eliminated. Supposing that signals A, B, C and D are input to the first, second, third and the fourth input terminals respectively, the first two stage cascaded connection of nMOS transistors represents logic A(B+C+D), the second and the third two stage cascaded connections of nMOS transistors representing logic (A+B)(C+D) and (A+B+C)D respectively.

Now, operation of the more-than-one detector is described.

In case signals A, B, C and D are all at logic '0', all the pMOS transistors MP1 to MP4 of the primary stage being ON, all the output lines L1 to L3 are supplied with the positive supply VDD. On the other hand, all the nMOS transistors MN11 to MN34 of the primary satage are OFF. Thus, all the three outputs of the primary stage are at logic '1' and the three input NAND gate outputs logic '0'.

In case only one of the signals A to D becomes at logic '1', all the output lines L1 to L3 remain supplied with the positive supply VDD, since it is only one pMOS transistor that is OFF of the pMOS transistors MP1 to MP4. As for the three cascaded connections of the nMOS transistors MN11 to NM14, MN21 to MN24 and MN31 to MN34, at least one of two stages of each cascaded connection rests OFF. So, output of the tree input NAND gate still remains at logic '0'.

Now, cases when at least two of the signals A to D become at logic '1' are considered. The cases can be devided into three patterns, a first pattern when the signal A and at least one of the signals B to D become at logic '1', a second pattern when at least one of the signals A and B and at least one of the signals C and D become at logic '1' and a third pattern when at least one of the signals A to C and the signal D become at logic '1'.

When the signal A and at least one of the signals B to D are at logic '1', the pMOS transistor MP1 and at least one $$A \cdot B + A \cdot C + A \cdot D + B \cdot C + B \cdot D + C \cdot D$$

of the pMOS transistors MP2 to MP4 are OFF. So, the output line L1 is cut from the positive supply VDD. On the other hand, the output line L1 is connected to the negative power supply VSS because nMOS transistor NM11 and at least one of nMOS transistors NM12 to NM 14 become ON. Therefore, the output line L1 outputs logic '0', which makes the output terminal OUT at logic '1' regardless of logics of other output lines L2 and L3.

When at least one of the signals A and B and at least one of the signals C and D become at logic '1', at least either one of the pMOS transistors MP1 and MP2 and at least either one of the pMOS transistors MP3 and MP4 are OFF, cutting the output line L2 from the positive supply VDD, and at least either one of nMOS transistors NM21 and NM22 and at least either one of nMOS transistors NM23 and NM24 become ON, connecting the output line L2 to the negative power supply VSS. So, the output line L2 becomes at logic '0', making the output terminal OUT of the three input NAND gate at logic '1'.

In the same way, when at least one of the signals A to C and the signal D become at logic '1', the output line L3 is cut from the positive supply VDD by the pMOS transistor MP4 and at least one of pMOS transistors MP1 to MP3 and connected to the negative power supply VSS through at least one of the nMOS transistors NM31 to NM33 and the nMOS transistor NM34, becoming at logic '0' and making the output terminal OUT of the three input NAND gate at logic '1'.

As above described, the primary stage consists of three OR-NAND compound gates having pMOS transistors MP1 to MP4 for common use, as follows:

a first OR-NAND compound gate composed of pMOS transisters MP1 to MP4 and nMOS transistors NM 11 to NM 14 represented by, $$L_1 = NOT(A \cdot (B+C+D));$$

a second OR-NAND compound gate composed of pMOS transisters MP1 to MP4 and nMOS transistors NM 21 to NM24 represented by, $$L_2 = NOT((A+B) \cdot (C+D));$$

and a third OR-NAND compound gate composed of pMOS transisters MP1 to MP4 and nMOS transistors NM 31 to NM34 represented by, $$L_3 = NOT((A+B+C)D);$$

where, $L_1$, $L_2$ and $L_3$ denote logics of output lines L1, L2 and L3 respectively.

Logic of the more-than-one detector of the embodiment is obtained from NAND of these three OR-NAND compound gates as;

$$\begin{aligned} &= NOT(L_1 + L_2 + L_3) \\ &= NOT(NOT(A \cdot B) + NOT(A \cdot C) + NOT(A \cdot D) + \\ &\quad NOT(A \cdot C) + NOT(A \cdot D) + NOT(B \cdot C) + NOT(B \cdot D) + \\ &\quad NOT(A \cdot D) + NOT(B \cdot D) + NOT(C \cdot D)). \end{aligned} \quad (1)$$

Generally speaking, a more-than-one detector of n (1<n) inputs of the embodiment is realized of a NAND gate of n−1 inputs supplied of n−1 OR-NAND compound gates, i-th (0<i<n) of the n−1 OR-NAND compound gates composed of a serial connection of n pMOS transistors, gated by the n inputs respectively, for common use of which both ends connected with a positive supply, and a two stage cascaded connection of n nMOS transistors, gated by the n inputs respectively, consisting of a first parallel connection of the first i of the n nMOS transistors (or the first nMOS transistor) and a second parallel connection of the latter n−i nMOS transistors (or n-th nMOS transistor) connected between connection of i-th and (i+1)-th of the n pMOS transistors and a negative supply, represented by, $$L_i = NOT\left(\left(\sum_{j=1}^{i} I_j\right) \cdot \left(\sum_{j=i+1}^{n} I_j\right)\right)$$

where $\Sigma_{j=1}^{i} I_j$ denotes OR logic of input logics $I_1$ to $I_i$ and $L_i$ denotes output logic of i-th of the n−1 OR-NAND gates.

Logic of the output terminal OUT of the more-than-one detector of n input is expressed as;

$$OUT = NOT\left(\sum_{i=1}^{n-1} L_i\right) = \quad (2)$$

$$NOT\left(\sum_{i=1}^{n-1} NOT\left(\left(\sum_{j=1}^{i} I_j\right) \cdot \left(\sum_{j=i+1}^{n} I_j\right)\right)\right)$$

As shown by the logical equations (1) and (2), there are OR logics of a plurality of the same items in the right sides of the equations, that is, items representing NOR logic of the input logics not adjoining are multiplexed.

Although this is a logical redundancy, there is a merit that it provides a high speed operation and no problem of threshold voltages of pMOS transistors afterward described, since each output line of the OR-NAND compound gates can be discharged to the negative supply through each corresponding two stage cascaded connection of nMOS transistors when the output line becomes logic '0'.

Now, a number of MOSFETs necessary for the more-than-one detector of n inputs of the embodiment is described.

There are needed n pMOS transistors for the serial connection for common use and n−1 OR-NAND compound gate of n nMOS transistors as above described in the primary stage, and n−1 pMOS transistors and n−1 nMOS transistors for the second stage of the NAND gate of n−1 input.

Therefore, the number of MOSFETs and the layout area needed for the MOSFETs result as follows.

|  | No. of pMOSs | No. of nMOSs | Total |
|---|---|---|---|
| primary stage | n | n(n − 1) | n² |
| secondary stage | n − 1 | n − 1 | (n − 1) · 2 |
| Total | 2n − 1 | (n + 1)(n − 1) | (n + 1)² − 3 |

|  | Area for pMOSs | Area for nMOSs | Total |
|---|---|---|---|
| primary stage | SN · n · 2 | SN · n(n − 1) | SN · n(n + 1) |
| secondary stage | SN · (n − 1) · 2 | SN · (n − 1) | SN · (n − 1) · 3 |
| Total | SN · (2n − 1) · 2 | SN · (n² − 1) | SN · (n² + 4n − 3) |

Thus, the more-than-one detector of the embodiment can be provided with about $n^2$ of MOSFETs of layout area of about $SN \cdot n^2$, when n is sufficiently large. These are ⅓ and ⅔ of those of the prior art, respectively.

Now, a second embodiment of the present invention will be described, wherein the logical redundancy beforehand described is avoided.

Figure 2:
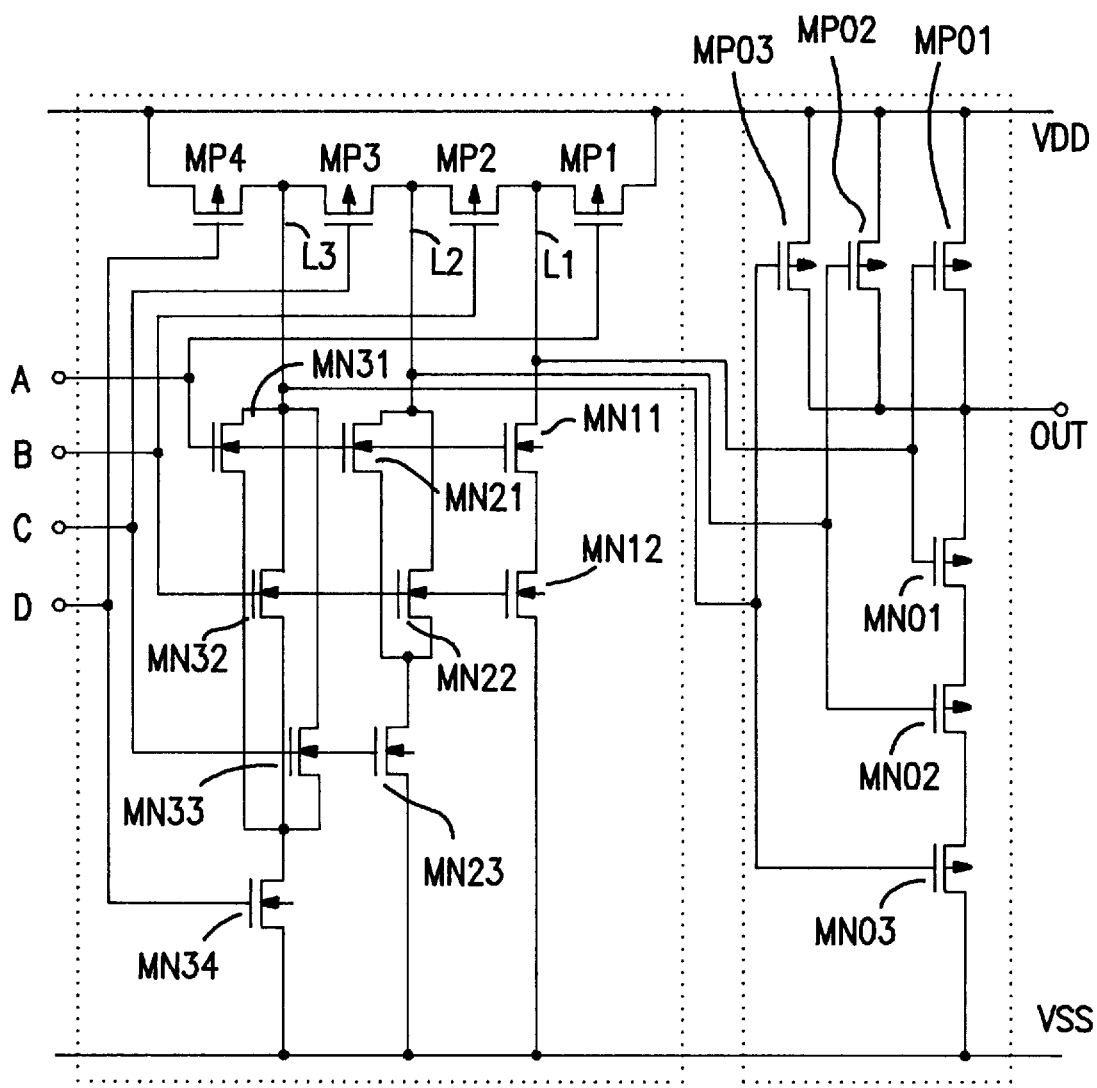
FIG. 2 is a circuit diagram illustrating a more-than-one detector of a second embodiment of the present invention, having four inputs by way of example.

FIG. 2 shows an example of the embodiment with four inputs having similar configuration to the more-than-one detector of FIG. 1. In the embodiment of FIG. 2 compared to the more-than-one detector of FIG. 1, the first two stage cascaded connection represented by NOT(A·(B+C+D)) is replaced by serial connection of two nMOS transistors MN11 and MN12 gated by the signals A and B respectively represented by NOT(A·B), and the second two stage cascaded connection represented by NOT((A+B)·(C+D)) replaced by another two stage cascaded connection of three nMOS transistors NM21 to NM23 gated by the signals A, B and C respectively represented by NOT((A+B)·C), resulting in a minimum logical configuration.

Suppose when the signals A and D are at logic '1' and the signals B and C are at logic '0'. The pMOS transistors MP1 and MP4 are OFF and pMOS transistors MP2 and MP3 remain ON. As for the nMOS transistors, only the third cascaded connection is conductive through nMOS transistors NM31 and NM34. So the output line L3 is connected to the negative supply VSS in the same way with the more-than-one detector of FIG. 1. And, the output lines L1 and L2, which were connected to the negative supply through the nMOS transistors MN14 and MN24 gated by the signal D in the more-than-one detector of FIG. 1, are still connected to the negative supply VSS since they are connected to the output line L3 through the pMOS transistors MP2 and MP3 remaining ON gated by signals B and C.

When also the signal C is at logic '1', the output line L2 is also connected to the negative supply VSS directly through the nMOS transistor MN23 and the output line L1 still discharged through the PMOS transistor MP2 regardless of OFF of the pMOS transistor MP3. Thus the more-than-one detector of the embodiment can be provided with still smaller number of MOSFETs than those of the more-than-one detector of FIG. 1.

Generally speaking, from the more-than-one detector reperesented by the logical equation (2), (i+2)-th nMOS transistor of i-th two stage cascaded connection gated by (i+2)-th signal $I_{i+2}$ can be still omitted compared to (i+1)-th two stage cascaded connection, since the logic realized by the (i+2)-th nMOS transistor of the i-th two stage cascaded connection is also realized by the (i+2)-th nMOS transistor of the (i+1)-th two stage cascaded connection connected through (i+1)-th pMOS transistor.

Therefore, in the embodiment, every i-th two stage cascaded connection can be composed of i+1 nMOS transistors as follows.

$$\text{OUT} = \text{NOT}\left(\sum_{i=1}^{n-1} L_i\right) = \text{NOT}\left(\sum_{i=1}^{n-1} \text{NOT}\left(I_{i+1} \cdot \sum_{j=1}^{i} I_j\right)\right)$$

Or, in the same way, every (n−i)-th two stage cascaded connection can be composed of i+1 nMOS transistors, too.

However, as beforehand described, there arises a problem of threshhold voltages that when an output line is discharged through a pMOS transistor, a charge corresponding to threshold voltage of the pMOS transistor may rest undischarged. Therefore, it is necessary to design so that potentials of the signals gating the pMOS transistors are lower than that of the negative supply VSS for discharging the output lines completely when the more-than-one detector may be disordered because of the undischarged potential.

Thus, a more-than-one detector can be provided with still smaller number of MOSFETs with still smaller layout area in the second embodiment as shown by following tables.

|  | No. of pMOSs | No. of nMOSs | Total |
|---|---|---|---|
| primary stage | n | (n + 2)(n − 1)/2 | (n² + 3n − 2)/2 |
| secondary stage | n − 1 | n − 1 | (n − 1) · 2 |
| Total | 2n − 1 | (n + 4)(n − 1)/2 | (n² + 7n − 6)/2 |

|  | Area for pMOSs | Area for nMOSs | Total |
|---|---|---|---|
| primary stage | SN · n · 2 | SN · (n + 2)(n − 1)/2 | SN · (n² + 5n − 2) |
| secondary stage | SN · (n − 1) · 2 | SN · (n − 1) | SN · (n − 1) · 3 |
| Total | SN · (2n − 1) · 2 | SN · (n² + 3n − 4)/2 | SN · (n² + 11n − 8)/2 |

Compared to the prior art, the more-than-one detector of the embodiment needs not but ⅙ of MOSFETs and ⅙ of layout area, when n is sufficiently large.

Figure 3:
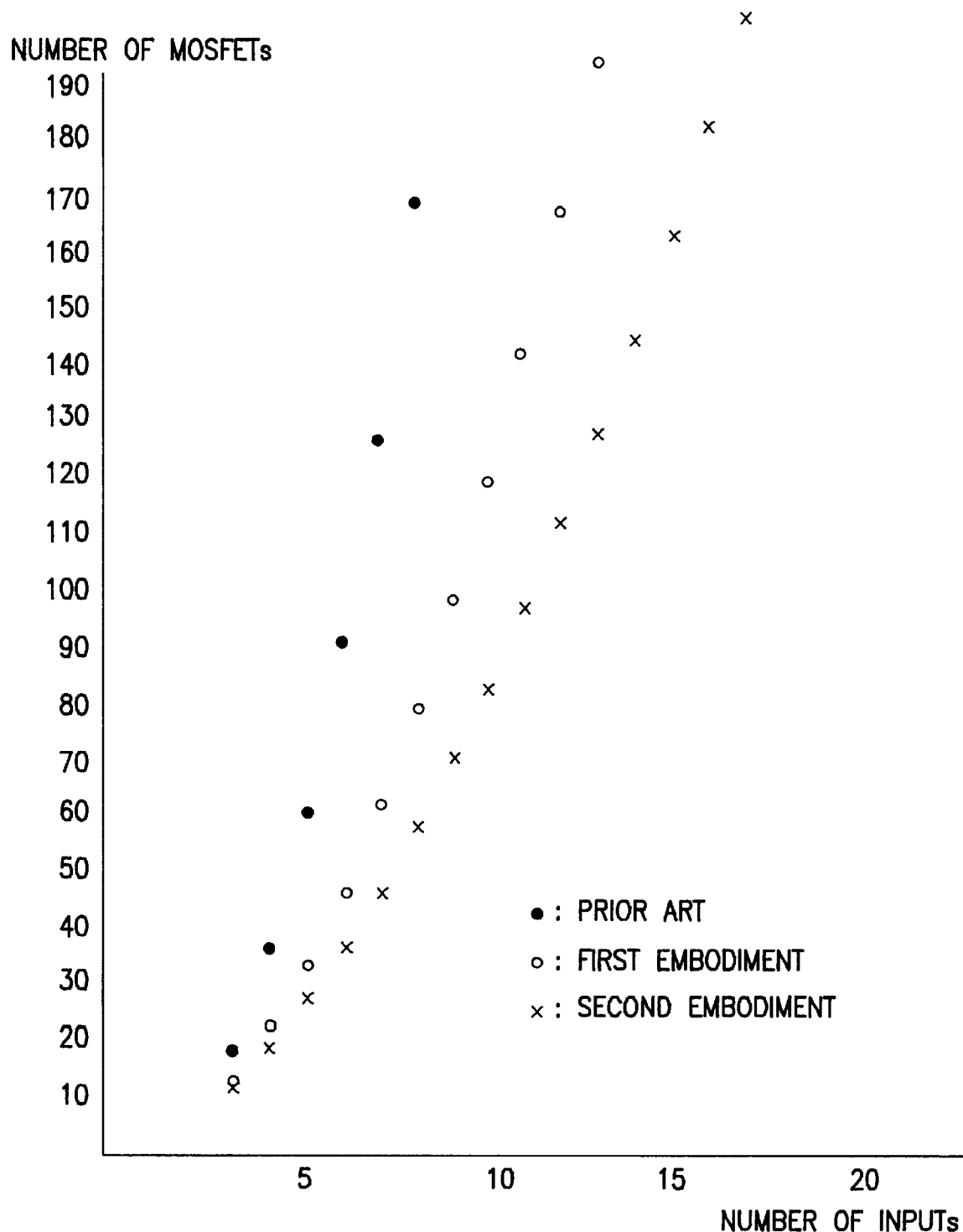
FIG. 3 is a graphic chart comparing numbers of MOSFETs needed for more-than-one detectors of the prior art, the first embodiment and the second embodiment.
Figure 4:
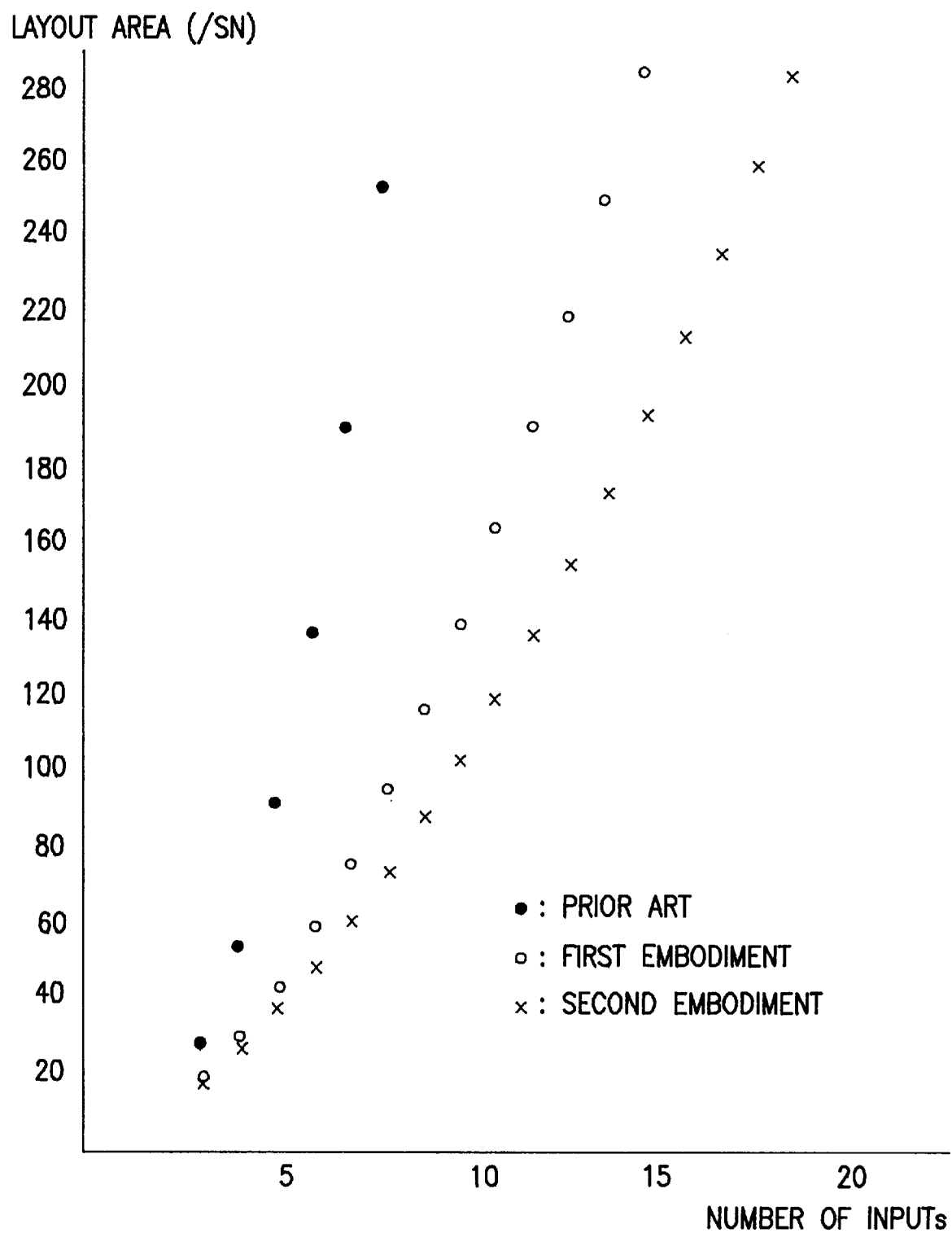
FIG. 4 is a graphic chart comparing layout areas needed for more-than-one detectors of the prior art, the first embodiment and the second embodiment.
Figure 5:
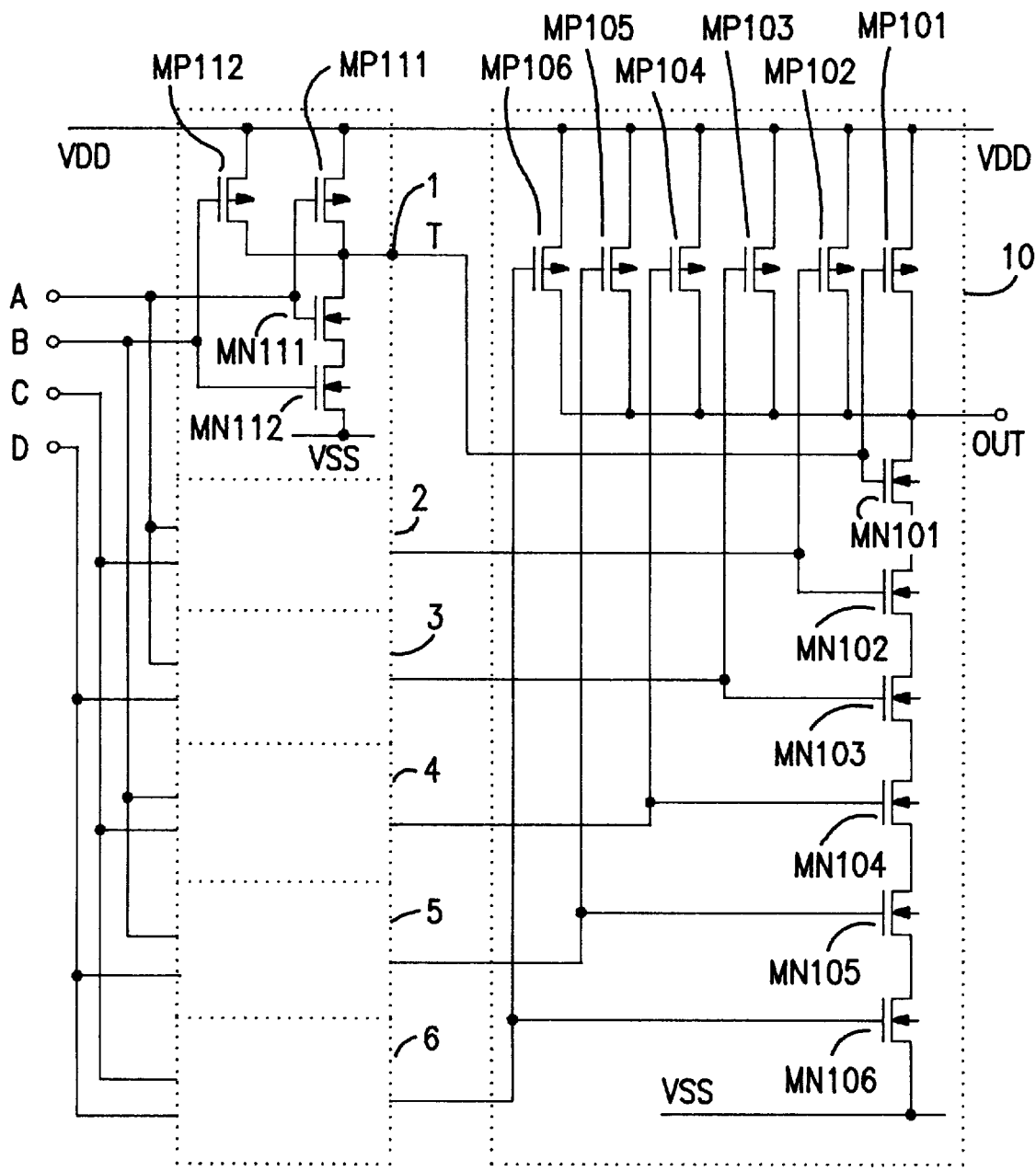
FIG. 5 is a circuit diagram of an example of a conventional more-than-one detector having four inputs.

FIG. 3 and FIG. 4 are graphic charts comparing numbers of MOSFETs and layout areas of more-than-one detectors of the prior art, the first embodiment and the second embodiment.

In the primary stage of the embodiments heretofore described, pMOS transistors and nMOS transistors are applied for charging and discharging output lines respectively. However, various modifications can be materialized in the scope of the present invention.

For example, the pMOS transistors for charging output lines may be replaced with nMOS transistors gated with input logics through inverters, or the nMOS transistors for discharging output lines may be similarly replaced with pMOS transistors gated with input logics through invertors, when the problem of the threshold voltage can be neglected.

For detecting simultaneous occurrence of more than one of logic '0', pMOS transistors and nMOS transistors of the primary stage are to be replaced with nMOS transistors and pMOS transistors respectively, the positive and the negative supplies being exchanged. The simultaneous occurrence of more than one of logic '0' may be detected also by providing inverters for every input terminal, of course.

Thus, in the present invention, more-than-one detectors of high operational speed and low power dissipation can be provided with smaller number of switching transistors than the prior art.

What is claimed is:

1. A detector for detecting simultaneous occurrence of more than one of the same logic out of n input signals, n being an integer larger than two; comprising:

a serial connection of n first type switching transistors, both ends of said serial connection connected to a first terminal of a power supply and each of said first type switching transistors gated by each of the n input signals respectively;

n−1 sets of two stage cascaded connection provided between a second terminal of said power supply and n−1 connections of said n first type transistors respectively, a first set of said n−1 sets of two stage cascaded connection comprising a stage of a second type switching transistor gated by a first signal of the n input signals and a stage of a parallel connection of n−1 second type switching transistors gated by the latter n−1 signals of the n input signals, a last set of said n−1 sets of said two stage cascaded connection comprising a stage of n−1 second type switching transistors gated by the first n−1 signals of the n input signals and a stage of a second type switching transistor gated by a last signal of the n input signals, and each i-th set of said n−1 sets of said two stage cascaded connections comprising a stage of a parallel connection of i second type switching transistors gated by the first i signals of the n input signals and a stage of a parallel connection of n-i second type switching transistors gated by the latter n-i signals of the n input signals, i being an integer more than one and smaller than n−1; and a NAND gate of n−1 inputs, each of said n−1 inputs connected to said n−1 connections of said n first type switching transistors.

2. A detector for detecting simultaneous occurrence of more than one of the same logic out of n input signals, n being an integer larger than two; comprising:

a serial connection of n first type switching transistors, both ends of said serial connection connected to a first terminal of a power supply and each of said first type switching transistors gated by each of the n input signals respectively;

n−1 sets of two stage cascaded connection provided between a second terminal of said power supply and n−1 connections of said n first type transistors respectively, a first set of said n−1 sets of said two stage cascaded connections comprising a stage of a second type switching transistors gated by a first signal of the n input signals and a stage of a second type switching transistor gated by a second signal of the n input signals, and each i-th set of said n−1 sets of said two stage cascaded connections comprising a stage of a parallel connection of i second type switching transistors gated by the first i signals of the n input signals and a stage of a second type switching transistor gated by a (i+1)-th signal of the n input signals, i being an integer more than one and smaller than n; and a NAND gate of n−1 inputs, each of said n−1 inputs connected to said n−1 connections of said n first type switching transistors.

* * * * *